United States Patent [19]

Tanaami et al.

[11] Patent Number: 5,047,732
[45] Date of Patent: Sep. 10, 1991

[54] WIDE BAND AMPLIFIER

[75] Inventors: Minoru Tanaami; Michiko Naito, both of Tokorozawa, Japan

[73] Assignee: Kabushiki Kaisha ENU ESU, Japan

[21] Appl. No.: 465,253

[22] PCT Filed: Aug. 7, 1989

[86] PCT No.: PCT/JP89/00805

§ 371 Date: Apr. 3, 1990

§ 102(e) Date: Apr. 3, 1990

[87] PCT Pub. No.: WO90/01831

PCT Pub. Date: Feb. 22, 1990

[30] Foreign Application Priority Data

Aug. 8, 1988 [JP] Japan .............................. 63-196149

[51] Int. Cl.$^5$ .............................................. H03F 3/68
[52] U.S. Cl. ..................................... 330/295; 330/286
[58] Field of Search ................. 330/84, 124 D, 124 R, 330/252, 295, 286, 149

[56] References Cited

U.S. PATENT DOCUMENTS

| | | | |
|---|---|---|---|
| 2,957,143 | 10/1960 | Enloe | 330/286 X |
| 3,531,730 | 9/1970 | Steckler | 330/299 |
| 3,947,637 | 3/1976 | Seki et al. | 330/295 X |
| 4,103,245 | 7/1978 | Yokoyama | 330/295 X |

Primary Examiner—Steven Mottola
Attorney, Agent, or Firm—Lowe, Price, LeBlanc & Becker

[57] ABSTRACT

A wide-band amplifier using a plurality of transistors used in transmission, voice, applications video, highvision in CATV, etc., for example. In the wide band amplifier, an input signal is applied in common across the respective bases and corresponding emitters of the plurality of transistors and the respective output currents are withdrawn from the transistor collectors. Thus, the output currents of the transistors are reduced, possible distortions in the outputs are greatly reduced, the upper operating frequency limit ($f_T$) is increased to about 3 GHz, and possible distortions in the output currents of the transistors are cancelled by inserting in the input circuit a transistor having the same characteristic as the first mentioned transistors. The amplifier includes the plurality of transistors connected in parallel, a constant-current circuit as an input source for the transistors, and at least one diode having the same characteristic as the transistors and connected in parallel in the input circuit of the amplifier. A voltage drop across a series connected circuit of a transistor ($Tr_D$) and a resistor ($R_{EO}$) due to the current flowing through the series connected circuit varies depending on a non-linear portion of the base-emitter characteristic of the transistor ($Tr_D$) compared to a similar amplifier without such a transistor ($Tr_D$). Therefore, a wide-band high-power amplifier is obtained without employing a feedback type configuration. In the wide band amplifier, distortions are small and eliminated, and signals of high frequencies are amplified with high quality and without oscillation.

5 Claims, 2 Drawing Sheets

WIDE BAND AMPLIFIER

TECHNICAL FIELD

The present invention relates to wide band amplifiers using transistors, and more particularly to a high-quality wide-band amplifier using transistors, which is used for transmissions, voice, video, high-vision applications, etc., in CATV.

BACKGROUND TECHNIQUES

Any conventional amplifiers used for transmission cables and so on in CATV are high-power branch amplifiers using LCs therein and plural amplifiers for special purposes are used in combination for each band.

Such a conventional amplifier is, however, required to be of a negative feedback type to eliminate distortions, which may cause oscillation and so on in a GHz-band thereby rendering the amplifiers unstable as well as rendering the circuit configuration complicated.

The present invention has been achieved in perception of the facts that if the output current of a transistor is reduced, for example, to about 10 mA, a possible distortion in the output of the transistor shall be reduced greatly, while the upper limit of operational frequency $f_T$ shall be raised to about 3 GHz, and that the distortion in the output current of the transistor can be canceled by inserting into its input circuit a transistor being the same characteristic as the former transistor. It is an object of the present invention to provide a high-quality wide-band amplifier which eliminates the above drawbacks due to use transistors.

DISCLOSURE OF THE INVENTION

A wide-band amplifier according to the present invention is arranged such that an input signal is applied in common across the bases and corresponding emitters of a plurality of transistors, and that the output currents are obtained from the corresponding collectors of the transistors. Thus, if five transistors Tr are used, for examples, the combined output current of 50 mA may be obtained and the output power becomes high, for example, $5^2(=25)$ times that of a single transistor. This will suffice for an amplifier for a 100-channel CATV to thereby be appropriate for a wide band of DC-3 GHz or so. The respective output currents of the transistors contain a very small distortion and respective distortions in the transistor output currents will not additively act on a circuit.

The wide-band amplifier according to the present invention includes transistors connected in parallel, a constant current circuit serving as an input power source for the transistors, and at least one diode having the same characteristic as the transistors and connected in parallel with an input circuit of the transistors. Thus, in the inventive wide-band amplifier, a voltage drop across a series circuit of a transistor $Tr_D$ and a resistor $R_{E0}$ due to a constant current flowing through the series circuit varies depending on a non-linear portion of the base-emitter characteristic of the transistor $Tr_D$ compared to an amplifier without a transistor such as $Rt_D$.

Therefore, without such transistor $Tr_D$, namely, if a constant input voltage is applied across the base and emitter of the first transistor $Tr_1$, its output current involves a distortion depending on its base-emitter characteristic. If a transistor $Tr_D$ is inserted in the input circuit as in the present invention, the input voltage changes depending on the inserted transistor $Tr_D$, as mentioned above, and hence distortions due to the transistor characteristics of the respective transitor circuits are canceled by distortions due to the transistor characteristic of the transistor $Tr_D$. Thus, the respective output currents $I_1, I_2, \ldots, I_n$ of the transistors $Tr_1, Tr_2, \ldots, Tr_n$ involve no distortions, so that a wide-band high-power amplifier without a feedback structure can be obtained very easily.

The beneficial effects of the present invention are that a voltage and a current can be amplified in a DC-GHz band without distortions, that a greatly stabilized amplifier without feedback and distortions and with an excellent temperature characteristic can be obtained, that the output power can be increased in proportion to the square of the number of output stages, and that a high-efficient power amplifier without switching and cross-over distortions can be obtained even in the B-class amplification when said in the audio output circuit.

As just described above, according to the inventive wide band amplifier, distortions are small or eliminated, and high frequencies up to GHz are amplified with high quality and without oscillation.

BEST MODE FOR CARRYING OUT THE INVENTION

The present invention will now be described in more detail with reference to the accompanying drawings.

The present invention has been made from perception of the fact that if the output currents of transistors used are reduced, for example, to about 10 mA, distortions in the outputs of the transistors are reduced greatly, that the upper operating frequency limit $f_T$ is hence increased to about 3 GHz, and that distortions in the output currents of the transistors can be canceled by inserting in the input circuit a transistor having the same characteristic as the former transistors.

Figure 1:
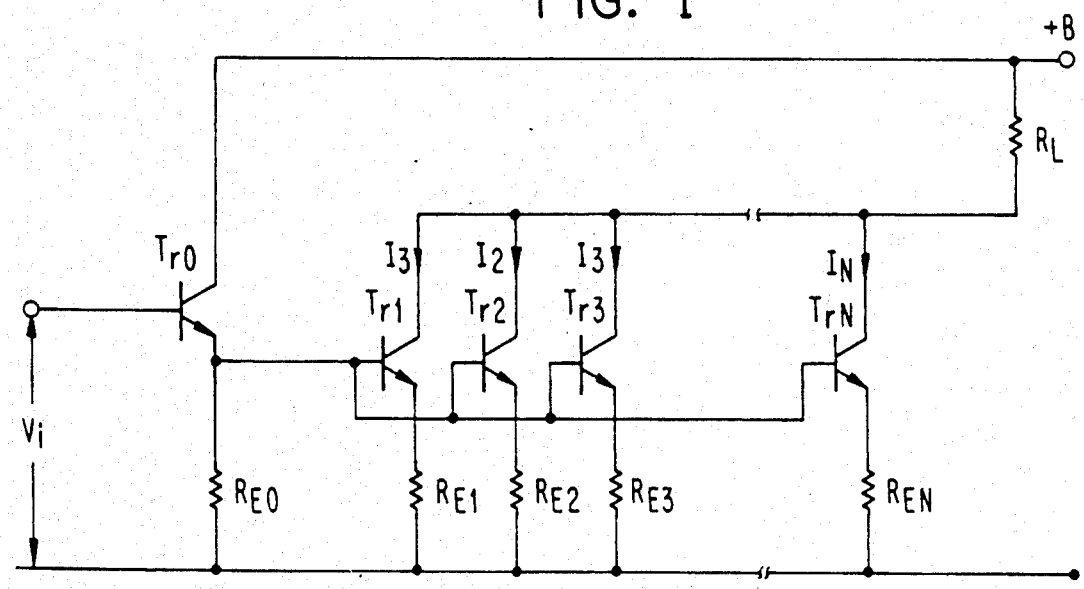
FIG. 1 is a schematic diagram of a wide-band amplifier according to the invention including parallel connected output transistors.

In the present invention, as shown in FIG. 1, a plurality of transistors $Tr_1, Tr_2, \ldots, Tr_n$ are connected in parallel so that each transistor provides an output current, for example of about 10 mA. An input signal is applied in common across the respective bases and corresponding emitters of the transistors and an output current is withdrawn from each of the collectors of the transistors.

Reference characters $R_L$ denotes a load.

If, for example, five transistors Tr are used in such arrangement, the total output current of 50 mA is obtained and the output power becomes high, for example, $5^2(=25)$ times that of a single transistor. This will suffice for a CATV 100-channel amplifier to thereby provide a wide band of DC-3 GHz or so. The respective output currents of the transistors contain a very small distortion and respective distortions in the transistor output currents will not additively act on the circuit.

Figure 2:
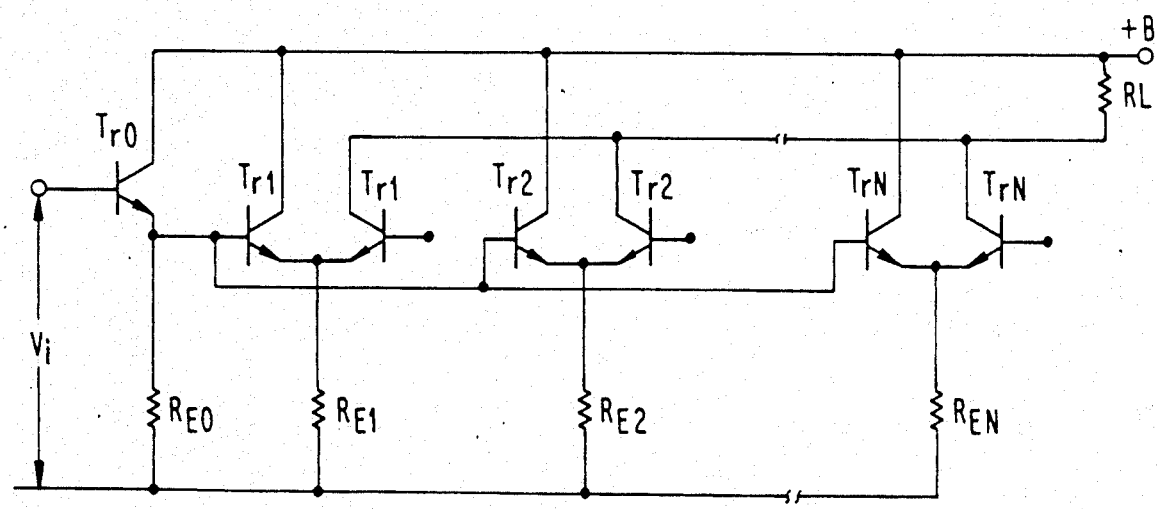
FIG. 2 is a schematic diagram of a wide-band amplifier according to the invention with pairs of transistors connected in a differential configuration.

FIG. 2 illustrates a circuit diagram of another embodiment of the present invention where each pair of transistors is connected in a differential configuration.

Figure 3:
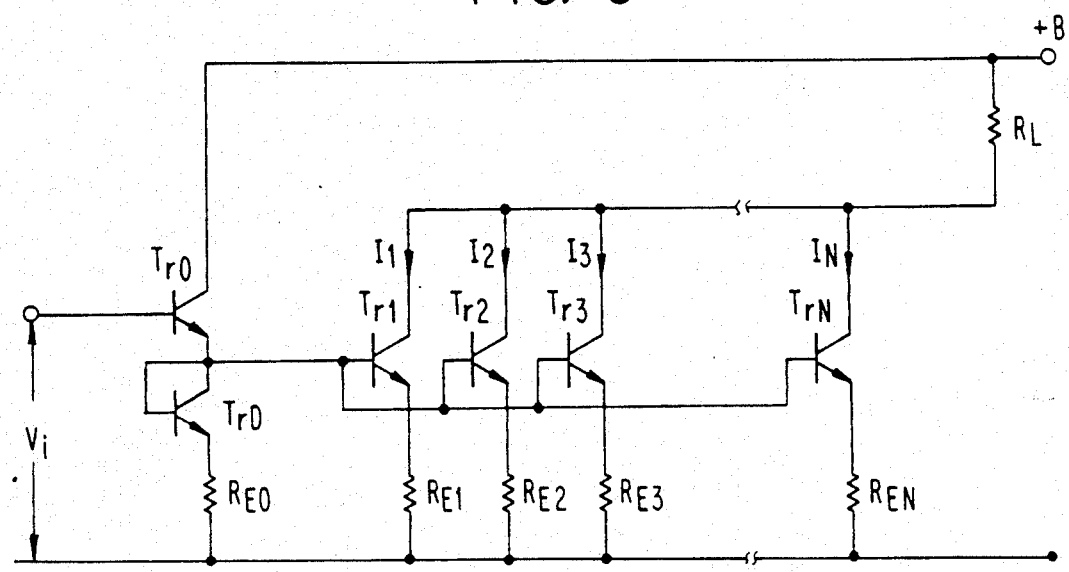
FIG. 3 is a schematic diagram of a wide-band amplifier according to the invention with a constant current source connected to the bases of the parallel output transistors.

In a further embodiment of the invention as shown in FIG. 3, a constant current source which uses a transistor $Tr_o$ as an input source for the transistors is used in order to completely eliminate possible distortions occurring in the respective output currents of the transistors. An input signal Vi is applied to the base of the transistor $Tr_o$. In addition, a series connected circuit of a diode or a transistor $Tr_D$ of diode connection and a resistor $R_{E0}$ is connected in parallel and in common across the respective bases and corresponding emitters of the transistors $Tr_1, Tr_2, \ldots, Tr_n$, the diode or transistor $Tr_D$ of diode connection having the same base-emitter characteristic as each of the transistors $Tr_1, Tr_2, \ldots, Tr_n$, and the resistor $R_{E0}$ having a resistance value equal to each of the emitter resistance values $R_{E1}, R_{E2}, \ldots, R_{En}$ of the transistors $Tr_1, Tr_2, \ldots, Tr_n$.

Since the inventive wide band amplifier has the above structure, a voltage drop across a series circuit of a transistor $Tr_D$ and a resistor $R_{E0}$ due to a constant current flowing through the series circuit varies depending on a non-linear portion of the base-emitter characteristic of the transistor $Tr_D$ compared to a similar amplifier without a transistor such as $Tr_D$.

Therefore, without such transistor $Tr_D$, namely, if a constant input voltage is applied across the base and emitter of the first transistor $Tr_1$, its output current involves a distortion depending on its base-emitter characteristic. If a transistor $Tr_D$ is inserted in the input circuit as in the present invention, the input voltage changes depending on the inserted transistor $Tr_D$, as mentioned above, and hence distortions due to the transistor characteristics of the respective transistor circuits are canceled by distortions due to the transistor characteristic or the transistor $Tr_D$. Thus, the respective output currents $I_1, I_2, \ldots, I_n$ of the transistors $Tr_1, Tr_2, \ldots, Tr_n$ involve no distortions, so that a wide-band high-power amplifier without a feedback structure can be obtained very easily.

Figure 4:
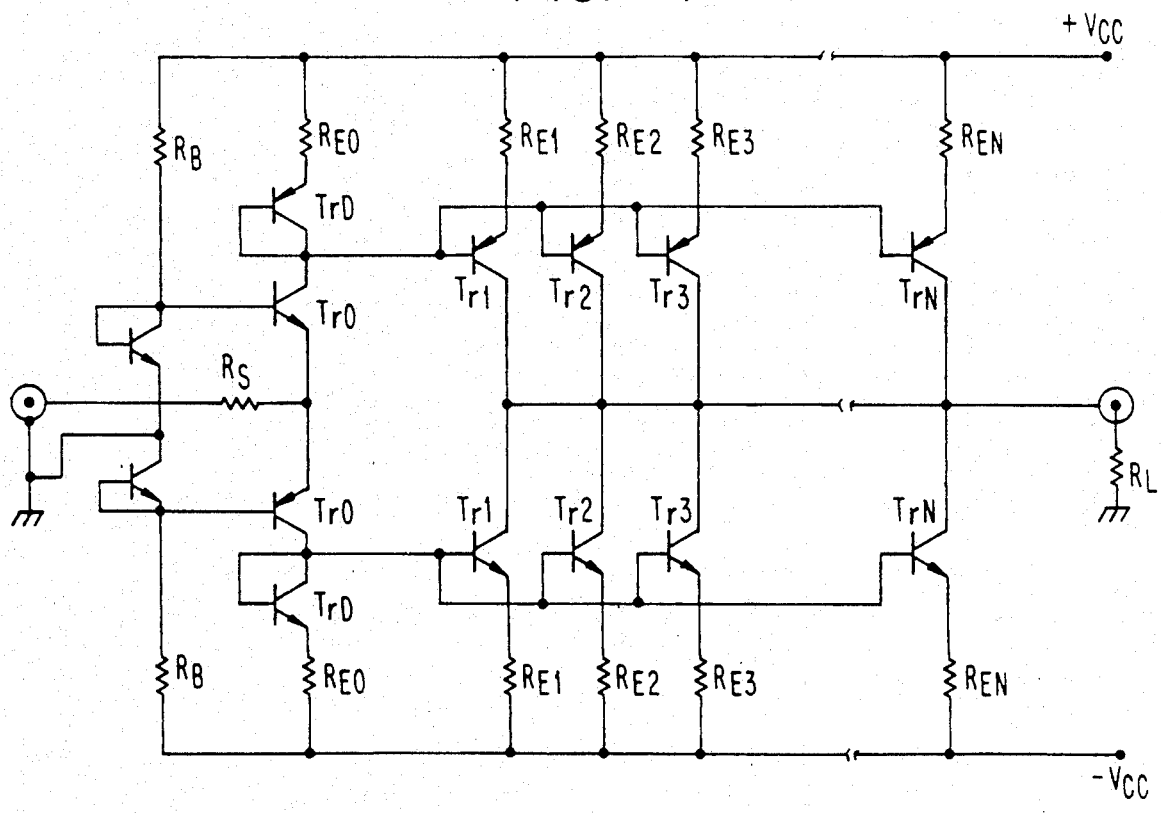
FIG. 4 is a schematic diagram of a wide-band amplifier according to the invention including parallel pairs of series connected PNP and NPN transistors.

In a further embodiment of the present invention, a current source input type amplifier may be used which uses PNP and NPN transistors as shown in FIG. 4.

INDUSTRIAL APPLICABILITY

As mentioned above, the inventive wide band amplifier is especially suitable for use as a high-quality wide-band amplifier using transistors, for example, in CATV transmissions, voice, video, high-vision applications, etc.

We claim:

1. A wide-band amplifier comprising:
a plurality of parallel connected transistors, each transistor including an emitter, base, and collector;
input means for receiving an input signal and applying said input signal to respective bases of said plurality of transistors, said input means including a transistor having a base receiving said input signal, a collector receiving a high power supply potential, and an emitter connected to a source of a low power supply potential through an emitter resistor, a driving signal supplied to the bases of said plurality of parallel connected transistors from said emitter of said input means transistor; and
output means for receiving respective output currents from the respective collectors of said plurality of transistors and providing said output current as an output signal.

2. A wide-band amplifier comprising:
a plurality of transistors connected in parallel, each of said transistors including an emitter connected through a respective emitter resistor to a source of a low power supply potential, base receiving a drive signal, and collector connected in common with collectors of others of said plurality of transistors to an output terminal;
a constant current circuit providing a constant current to said bases of said plurality of transistors; and
a diode connected in parallel with the bases of said plurality of transistors between said bases and said source of low power supply potential through a current limiting resistor, said diode having an electrical characteristic in common with an electrical characteristic of said transistors.

3. A wide-band amplifier comprising:
a first transistor having a base terminal for receiving an input signal, a collector receiving a power supply voltage, and an emitter supplying an intermediate signal;
a first emitter resistor having a first terminal connected to said emitter of said input transistor and a second terminal connected to a source of a common voltage different than said power supply voltage;
a plurality of second emitter resistors having resistance values substantially equal to a resistance value of said first emitter resistor, each having a first terminal connected to said source of said common potential; and
a plurality of second transistors each including
  (i) an emitter connected to a second terminal of a respective one of said second emitter resistors for establishing an emitter-collector current path,
  (ii) a collector connected in common with others of said second transistors to an output node for supplying a combined output signal, and
  (iii) a base connected in common with others of said second transistors to said emitter of said first transistor for receiving said intermediate signal.

4. The wide-band amplifier of claim 3, further comprising a third transistor connected in series between (i) said first transistor and (ii) said first emitter resistor, said third transistor having a base and collector commonly connected to said bases of said second transistors commonly connected to said emitter of said first transistor and an emitter connected to said first terminal of said first emitter resistor.

5. The wide-band amplifier comprising:
input and output terminals;
source of positive, negative and common power supply potentials;
first and second biasing resistors having first terminals respectively connected to said sources of positive and negative power supply potentials;
a first transistor having a base and collector commonly connected to a second terminal of said first biasing resistor and an emitter connected to said source of common power supply potential;
a second transistor having a base and emitter commonly connected to a second terminal of said second biasing resistor and a collector connected to said source of common power supply potential;

an input resistor having a first terminal connected to said input terminal and a second terminal for supplying an input signal applied at said input terminal;

first and second emitter resistors each having a first terminal connect to a respective one of said sources of positive and negative power supply potential;

a third transistor having an emitter connected to a second terminal of said first emitter resistor;

a fourth transistor having a collector commonly connected to a base and collector of said third transistor, a base connected to said commonly connected base and collector of said first transistor, and an emitter connected to said second terminal of said input resistor;

a fifth transistor having an emitter connected to a second terminal of said second emitter resistor;

a sixth transistor having a collector commonly connected to a base and collector of said fifth transistor, a base connected to said commonly connected base and emitter of said second transistor, and an emitter connected in common with said emitter of said fourth transistor to said second terminal of said input resistor;

first and second groups of emitter resistors, resistors of said first bank having first terminals connected to said source of said positive power supply potential and resistors of said second bank having first terminals connected to said source of said negative power supply potential;

a first group of transistors, each transistor of said first group having an emitter connected to a second terminal of a respective one of said first group of emitter resistors, a base commonly connected to said collector and base of said third transistor and said collector of said fourth transistor, and a collector connected to said output terminal; and a second group of transistors, each transistor of said second group having an emitter connected to a second terminal of a respective one of said second group of emitter resistors, a base commonly connected to said collector and base of said fifth transistor and said collector of said sixth transistor, and a collector connected to said output terminal.

* * * * *